(12) United States Patent
Karrat et al.

(10) Patent No.: US 9,999,163 B2
(45) Date of Patent: Jun. 12, 2018

(54) HIGH-EFFICIENCY DATA CENTER COOLING

(75) Inventors: Wally Karrat, Danbury, CT (US); Bret W. Lehman, Raleigh, NC (US); Ronald J. Licare, Port Chester, NY (US); Daniel Pare, Granby (CA)

(73) Assignee: International Business Machines Corporation, Armonk, NY (US)

( * ) Notice: Subject to any disclaimer, the term of this patent is extended or adjusted under 35 U.S.C. 154(b) by 1569 days.

(21) Appl. No.: 13/591,753

(22) Filed: Aug. 22, 2012

(65) Prior Publication Data

US 2014/0053588 A1 Feb. 27, 2014

(51) Int. Cl.
*H05K 7/20* (2006.01)
*F25B 7/00* (2006.01)
*F25D 1/00* (2006.01)

(52) U.S. Cl.
CPC .......... *H05K 7/20836* (2013.01); *F25D 1/00* (2013.01); *F25B 7/00* (2013.01)

(58) Field of Classification Search
CPC .......... H05K 7/20836; F25B 7/00; F25D 1/00
See application file for complete search history.

(56) References Cited

U.S. PATENT DOCUMENTS

| | | | |
|---|---|---|---|
| 2,707,869 A * | 5/1955 | Dennison | F25B 7/00 62/157 |
| 4,023,947 A * | 5/1977 | Ferry | F25D 1/00 165/248 |
| 4,484,449 A * | 11/1984 | Muench | F25B 7/00 318/112 |
| 5,388,420 A * | 2/1995 | Yoshida | F25B 7/00 165/902 |
| 5,894,739 A * | 4/1999 | Temos | F24F 5/0017 62/436 |
| 6,397,618 B1 * | 6/2002 | Chu | F25B 25/00 165/104.22 |
| 2004/0159119 A1 * | 8/2004 | Hu | B64D 13/00 62/435 |

(Continued)

FOREIGN PATENT DOCUMENTS

CN 1291711 A 4/2001
CN 1292078 A 4/2001

(Continued)

*Primary Examiner* — Ljiljana Ciric
*Assistant Examiner* — Alexis Cox
(74) *Attorney, Agent, or Firm* — Christopher K. Mclane; Hunter E. Webb; Koehane & D'Alessandro, PLLC

(57) ABSTRACT

Embodiments of the invention provide high-efficiency cooling in a data center in response to a cooling and/or humidity demand using a system having multiple cooling loops to allow for a higher chilled liquid temperature of a first chilled liquid loop, while maintaining data center room temperature and humidity control. Specifically, the system includes a plurality of integrated cooling systems each comprising one or more specifically sized chillers and a liquid loop to address the cooling demand. A free cooling heat exchanger is coupled to the first liquid loop for use when a wet-bulb temperature surrounding the data center is at or below a free cooling set point of the first chilled liquid loop. The system isolates humidity control components to a second chilled liquid loop, and enables greater control of the first chilled liquid loop of the data center to meet specific IT loads.

10 Claims, 3 Drawing Sheets

(56) References Cited

U.S. PATENT DOCUMENTS

| | | | |
|---|---|---|---|
| 2005/0138958 A1* | 6/2005 | Huang | F25D 17/02 62/498 |
| 2005/0178348 A1 | 8/2005 | Werner et al. | |
| 2008/0307806 A1* | 12/2008 | Campbell | F24F 5/0017 62/121 |
| 2009/0103266 A1* | 4/2009 | Huettner | F28D 15/00 361/698 |
| 2009/0210096 A1 | 8/2009 | Stack et al. | |
| 2010/0065650 A1* | 3/2010 | Phillips | F24F 3/001 236/12.13 |
| 2010/0078160 A1 | 4/2010 | Novotny et al. | |
| 2010/0130117 A1 | 5/2010 | Larsen | |
| 2011/0154842 A1* | 6/2011 | Heydari | H05K 7/20836 62/259.2 |
| 2012/0012278 A1 | 1/2012 | Noteboom et al. | |
| 2012/0065809 A1* | 3/2012 | Allard | H05K 7/20836 700/300 |
| 2012/0123607 A1* | 5/2012 | Canney | G05D 23/1919 700/300 |
| 2014/0029196 A1* | 1/2014 | Smith | G05D 23/1934 361/679.53 |

FOREIGN PATENT DOCUMENTS

| | | |
|---|---|---|
| CN | 1890515 A | 1/2007 |
| CN | 102467202 A | 5/2012 |
| CN | 102549391 A | 7/2012 |
| DE | 102004047452 A1 | 4/2006 |
| DE | 69931350 T2 | 9/2006 |
| DE | 102009059237 A1 | 6/2011 |
| DE | 102010048853 A1 | 4/2012 |

* cited by examiner

HIGH-EFFICIENCY DATA CENTER COOLING

BACKGROUND

Technical Field

This invention relates generally to managing energy in a data center, and more specifically, to high-efficiency data center cooling using a plurality of cooling systems.

Related Art

Traditional data centers conventionally include a plurality of individual computing resources contained within a housing structure. Data centers, or other physical spaces, benefit from an adequate and optimized power and cooling infrastructure. Maintaining data centers at desired temperatures (e.g., set points) helps prevent computer hardware (e.g., IT infrastructure) from overheating and malfunctioning. To this end, many data centers are cooled to relatively low temperatures (e.g., 75° F.) to increase equipment reliability and useful life, and to avoid downtime for repair and/or replacement.

As data centers consume more and more electricity, and Chief Information Officer (CIO) budgets remain relatively fixed, extreme pressure has been mounting to make data centers more energy efficient. Data centers are becoming more virtualized, leading to higher and more unpredictable cooling requirements, making energy efficiency more challenging. In response, standards organizations like the American Society of Heating Refrigeration and Air conditioning Engineers (ASHRAE) and the European Union Code of Conduct for Datacenters, have adopted more relaxed environmental standards for data centers, thus allowing for higher server inlet temperatures. Higher server inlet conditions encourage new and innovative design and control concepts that are unique to the data center space. Unlike other types of building environments, data centers have extremely low latent loads because IT load contributes only sensible heat, as there are very few human beings in the space to add humidity to the data center air, and fresh air make up is very low.

It is possible to design the infrastructure that supports the data center with variable speed devices and options for free cooling when outside environmental conditions are favorable. While these methods may result in measurable energy savings, they do not fully maximize varying environmental conditions for increased savings.

SUMMARY

In general, embodiments of the invention provide approaches for high-efficiency cooling in a data center in response to a cooling and/or humidity demand using a data center cooling system having multiple cooling loops to allow for a higher chilled liquid temperature of a first chilled liquid loop, while maintaining data center room temperature and humidity control. Specifically, the data center cooling system includes a plurality of integrated cooling systems each comprising one or more specifically sized chillers and a liquid loop to address the cooling demand. A free cooling heat exchanger is coupled to the first liquid loop for use when a wet-bulb temperature surrounding the data center is capable of producing a condenser water that is at a differential temperature below a return temperature of the first chilled liquid loop. The data center cooling system isolates humidity control components to a second chilled liquid loop, and enables greater control of the first chilled liquid loop of the data center to meet specific IT loads, thereby maximizing energy savings during both normal and free cooling operation.

One aspect of the present invention includes a data center cooling system comprising: a first cooling system operable to maintain a predetermined set point of a first liquid loop to address a cooling demand within the data center, the first cooling system comprising a chiller; a second cooling system operable to maintain a pre-determined set point of a second liquid loop to address the humidity and cooling demand within the data center, the second cooling system comprising one or more chillers sized to have a capacity lesser than that of the chiller of the first liquid loop, and wherein the predetermined set point of the first liquid loop is higher than the predetermined set point of the second liquid loop; a heat exchanger coupled to the first liquid loop for use when a wet-bulb temperature surrounding the data center is below a pre defined set point the heat exchanger configured to operate in parallel or in series with the chiller of the first liquid loop; and a flow control device coupling the first cooling system with the second cooling system.

Another aspect of the present invention provides a data center cooling system comprising: a memory medium comprising instructions; a bus coupled to the memory medium; and a processor coupled to a controller via the bus that when executing the instructions causes the system to: analyze an environmental condition of the data center; activate a heat exchanger in response to the environmental condition to maintain a predetermined set point for a first liquid loop of a first cooling system in the case that an outside wet-bulb temperature surrounding the data center is below a free cooling set point; activate a chiller of a second cooling system to address the environmental condition in the case of either of the following: the outside ambient temperature surrounding the data center is at a preset differential above the free cooling set point, and the free cooling heat exchanger is unable to maintain the predetermined set point for the first cooling system; operate a flow control device to maintain the predetermined set point for a liquid loop of the first cooling system; and activate a chiller of the first cooling system to address the environmental condition in the case that the activation of the chiller of the second cooling system is unable to maintain the predetermined set point for the first liquid loop.

Another aspect of the present invention provides a computer-readable storage medium storing computer instructions, which, when executed, enables a computer system to provide data center cooling, the computer instructions comprising: analyzing an environmental condition of the data center; activating a heat exchanger in response to the environmental condition to maintain a predetermined set point for a first liquid loop of a first cooling system in the case that an outside wet-bulb temperature surrounding the data center is below a free cooling set point; activating a chiller of a second cooling system to address the environmental condition in the case of either of the following: the outside ambient temperature surrounding the data center is above the free cooling set point, and the free cooling heat exchanger is unable to maintain the predetermined set point for the first cooling system; operating a flow control device to maintain the predetermined set point for a liquid loop of the first cooling system; and activating a chiller of the first cooling system to address the environmental condition in the case that the activation of the chiller of the second cooling system is unable to maintain the predetermined set point for the first liquid loop.

Another aspect of the present invention provides a method for data center cooling, the method comprising: analyzing, by a controller, an environmental condition of the data center; activating, by the controller, a heat exchanger in response to the environmental condition to maintain a predetermined set point for a first liquid loop of a first cooling system in the case that an outside wet-bulb temperature surrounding the data center is below a free cooling set point; activating, by the controller, a chiller of a second cooling system to address the environmental condition in the case of either of the following: the outside ambient temperature surrounding the data center is above the free cooling set point, and the free cooling heat exchanger is unable to maintain the predetermined set point for the first cooling system; operating, by the controller, a flow control device to maintain the predetermined set point for a liquid loop of the first cooling system; and activating, by the controller, a chiller of the first cooling system to address the environmental condition in the case that the activation of the chiller of the second cooling system is unable to maintain the predetermined set point for the first liquid loop.

BRIEF DESCRIPTION OF THE DRAWINGS

These and other features of the invention will be more readily understood from the following detailed description of the various aspects of the invention taken in conjunction with the accompanying drawings in which.

Figure 1:
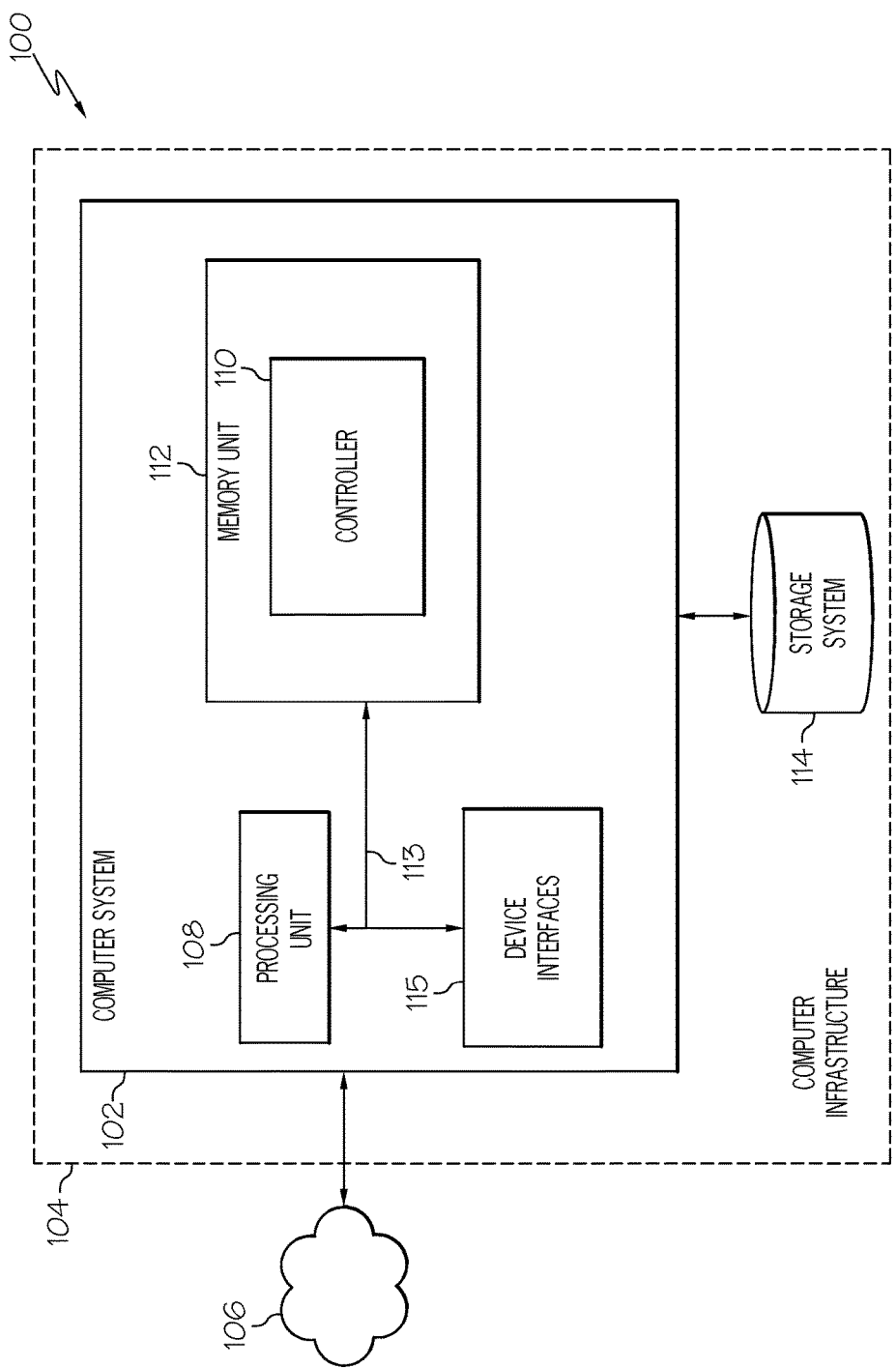
FIG. 1 shows a schematic depiction of an exemplary computing environment for enabling data center cooling according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments now will be described more fully herein with reference to the accompanying drawings, in which exemplary embodiments are shown. Embodiments of the invention provide approaches for high-efficiency cooling in a data center in response to a cooling and/or humidity demand using a data center cooling system having multiple cooling loops to allow for a higher chilled liquid temperature of a first chilled liquid loop, while maintaining data center room temperature and humidity control. Specifically, the data center cooling system includes a plurality of integrated cooling systems each comprising one or more specifically sized chillers and a liquid loop to address the cooling demand. A free cooling heat exchanger is coupled to the first liquid loop for use when a wet-bulb temperature surrounding the data center is below a differential of the return temperature (at or below a free cooling set point) of the first chilled liquid loop. The data center cooling system isolates humidity control components to a second chilled liquid loop, and enables greater control of the first chilled liquid loop of the data center to meet specific IT loads, thereby maximizing energy savings during both normal and free cooling operation.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

With reference now to the figures, FIG. 1 depicts a system 100 that facilitates data center cooling in response to an environmental condition (e.g., a cooling and/or humidity demand). As shown, system 100 includes computer system 102 deployed within a computer infrastructure 104. This is intended to demonstrate, among other things, that embodiments can be implemented within a network environment 106 (e.g., the Internet, a wide area network (WAN), a local area network (LAN), a virtual private network (VPN), etc.), a cloud-computing environment, or on a stand-alone computer system. Still yet, computer infrastructure 104 is intended to demonstrate that some or all of the components of system 100 could be deployed, managed, serviced, etc., by a service provider who offers to implement, deploy, and/or perform the functions of the present invention for others.

Computer system 102 is intended to represent any type of computer system that may be implemented in deploying/realizing the teachings recited herein. In this particular example, computer system 102 represents an illustrative system for providing data center cooling. It should be understood that any other computers implemented under various embodiments may have different components/software, but will perform similar functions. As shown, computer system 102 includes a processing unit 108 capable of operating with a controller 110 stored in a memory unit 112 to provide data center cooling, as will be described in further detail below. Also shown is a bus 113, and device interfaces 115.

Processing unit 108 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 receives signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 108 executes computer program code, such as program code for operating controller 110, which is stored in memory unit 112 and/or storage system 114. While executing computer program code, processing unit 108 can read and/or write data to/from memory unit 112 and storage system 114. Storage system 114 may comprise VCRs, DVRs, RAID arrays, USB hard drives, optical disk recorders, flash storage devices, and/or any other data processing and storage elements for storing and/or processing data. Although not shown, computer system 102 could also include I/O interfaces that communicate with one or more hardware components of computer infrastructure 104 that enable a user to interact with computer system 102 (e.g., a keyboard, a display, camera, etc.).

Figure 2:
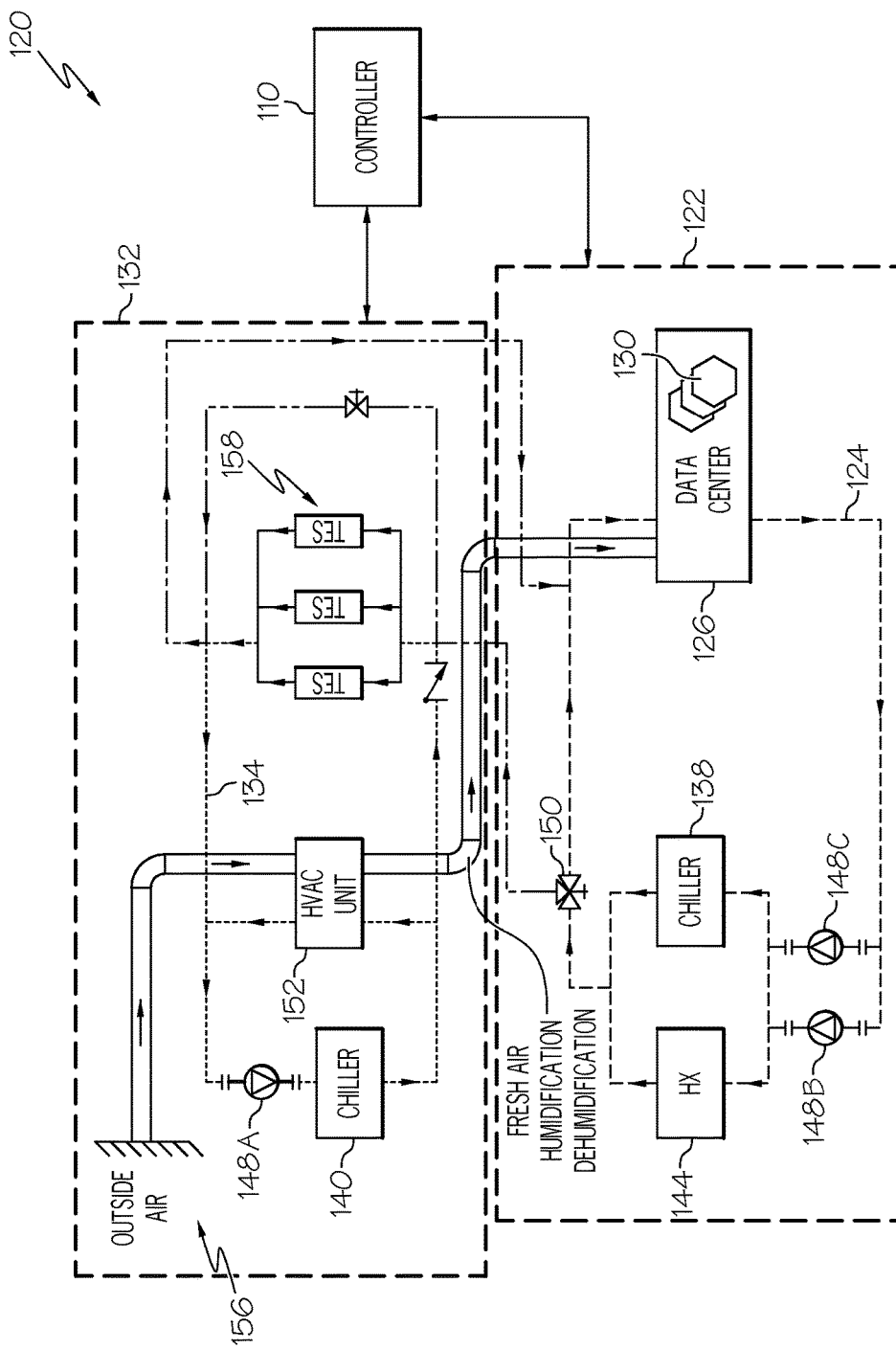
FIG. 2 shows a schematic depiction of a data center cooling system according to illustrative embodiments.

Referring now to FIG. 2, the structure and operation of a data center cooling system 120 will be described in greater detail. As shown, data center cooling system 120 includes a first (i.e., primary) cooling system 122 operable to maintain a predetermined set point of a first liquid (e.g., water) loop 124 to address a cooling and humidity demand within a data center 126, the cooling demand caused by an increased temperature resulting from an IT load, for example. Data center cooling system 120 further comprises a second (i.e., secondary) cooling system 132 operable to maintain a pre-determined set point of a second liquid (e.g., water) loop 134 to address the cooling demand within data center 126. In exemplary embodiments, the predetermined set point of first liquid loop 124 is maintained higher than the predetermined set point of second liquid loop 134. In one non-limiting example, the set point temperature of second liquid loop 134 is approximately 40-50° F., while the set point temperature of first liquid loop 124 is approximately 55-65° F. entering data center 126 and approximately 65-75° F. exiting data center 126. As will be described in further detail below, integration of first liquid loop 124 and second liquid loop 134 according to exemplary embodiments allows for a higher chilled liquid temperature of first liquid loop 124, thereby maximizing energy efficiency within data center 126 during both normal and free cooling operation.

As shown, data center cooling system 120 further includes one or more chillers 138 operable with first liquid loop 124, and one or more chillers 140 operable with second liquid loop 134, wherein chiller 140 of second liquid loop 134 is purposely sized to have a lesser capacity (i.e., heat transfer capacity (enthalpy difference) and rate of flow of liquid coolant) than chiller 138 of first liquid loop 124. In one non-limiting embodiment, chiller 140 of second liquid loop 134 has a capacity of approximately 20-30% of the capacity of chiller 138 of first liquid loop 124.

Data center cooling system 120 further includes one or more heat exchangers 144 coupled to first liquid loop 124 for use when an ambient temperature surrounding data center 126 is below a pre-defined set point. Specifically, heat exchanger 144 is configured to maintain the set point of first liquid loop 124 during free cooling operation of data center cooling system 120. That is, during cooler weather conditions, the outside ambient temperature can help save energy in data center cooling system 120. Free cooling can be used to save energy by maintaining chiller 138 of first liquid loop 124 in an 'off' state for a longer period of time whenever the outside wet-bulb temperature drops below the required set point (i.e., a differential with the return temperature of first liquid loop 124). In one non-limiting embodiment, first liquid loop 124 contributes to an increase of approximately 50% more free cooling hours for data center 120 before returning to normal operation. As shown, heat exchanger 144 operates in parallel or in series with chiller 138 of first liquid loop 124.

Data center cooling system 120 further includes a plurality of pumps 148A-C, and a flow control device (e.g., a three-way valve) 150 coupling first liquid loop 124 of first cooling system 122 with second liquid loop 134 of second cooling system 132. As will be described in further detail below, in response to a cooling demand during operation, one or more pumps 148A-C are activated, and flow control device 150 opens (e.g., from first liquid loop 124 to second liquid loop 134) to maintain the set point of first liquid loop 124. This intermixing of liquid between the two liquid loops lowers the temperature of first liquid loop 124, thus preventing, or at least delaying, the starting of chiller 138 of first cooling system 122.

Data center 126 further includes a plurality of sensors 130 for capturing data representing attributes of the environment surrounding and within data center 126 including, but not limited to: temperature, humidity, airflow, carbon emissions, etc. Sensors 130 can include any type of sensor capable of capturing environmental conditions of data center 126. Data center 126 collects and routes signals representing outputs from sensors 130 to controller 110. The signals can be transmitted over a LAN and/or a WAN (e.g., T1, T3, 56 kb, X.25), broadband connections (ISDN, Frame Relay, ATM), wireless links (802.11, Bluetooth, etc.), and so on. Different sensor systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)). In some embodiments, sensors 130 are capable of two-way communication, and thus can receive signals (to power up, to sound an alert, etc.) from controller 110.

Data center cooling system 120 further includes a HVAC unit 152 operable with second cooling system 132 for maintaining a dew point of data center 126. More specifically, HVAC unit 152 operates with controller 110 and chiller 140 to control humidity in data center 126 using dew point control in HVAC unit 152. In one embodiment, HVAC unit 152 provides humidity control support to cooling system 132, which may be activated in response to a humidity demand in data center 120.

It should be understood that HVAC unit 152 may include ductwork, multiple air supply vents and diffusers (not shown). Additionally, it should be understood that the HVAC ductwork, multiple air supply vents and diffusers can be in the ceiling of data center 126, the walls of data center 126 (e.g., at different elevations on the walls) and/or the floors of data center 126 (e.g., within a sub floor wiring layer). As shown, HVAC unit 152 is coupled to second liquid loop 134, and is allowed limited direct operation with first cooling system 122 due to the decreased dehumidification need within data center 126.

In one embodiment, second cooling system 132 includes a set of thermal energy storage (TES) units 158 coupled to second liquid loop 134 for temporary storage of thermal energy. TES units 158 improve energy performance by smoothing energy supply and increasing reliability. In one non-limiting example, chiller 140 works in conjunction with TES units 158 during peak daytime hours to manage the cooling load. During off-peak hours, chiller 140 charges TES units 158 for use during future cooling, e.g., in case of power failure.

Figure 3:
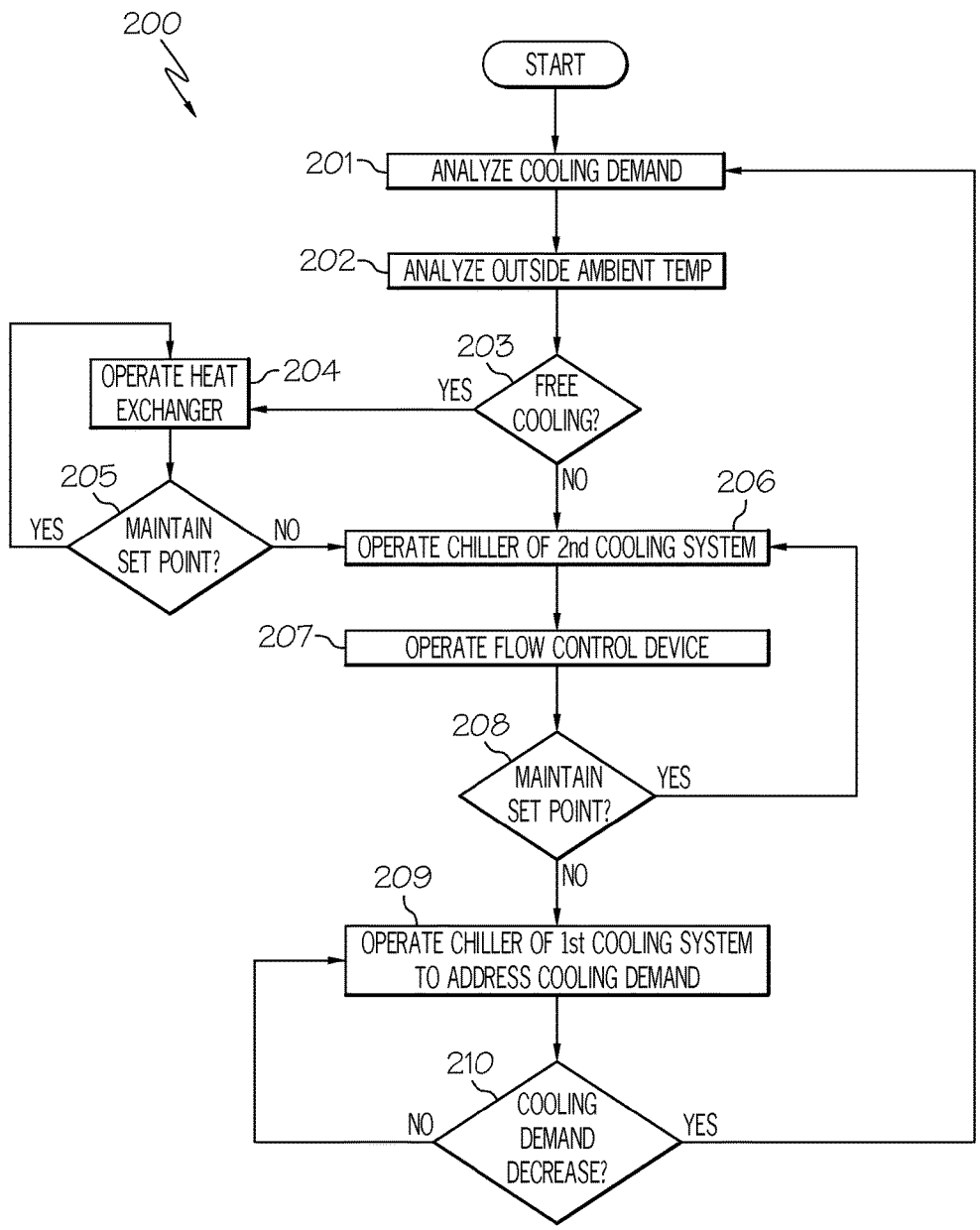
FIG. 3 shows a process flow for data center cooling according to illustrative embodiments.

Referring now to FIGS. 2-3, an exemplary control sequence 200 for providing data center cooling will be described in greater detail. In this embodiment, exemplary control sequence 200 considers both normal and free cooling operation. As shown, control sequence 200 begins, and at 201, a cooling demand (e.g., a temperature increase from an IT load) received from the sensors 130 of the data center 126 is analyzed. At 202, the outside ambient wet and dry temperature surrounding the data center is analyzed. At 203, it is determined whether the outside ambient temperature surrounding data center 126 is above or below a free cooling set point. If the ambient temperature is below the free cooling set point, data center cooling system 120 operates in a free cooling mode, and heat exchanger 144 is activated at 204. Heat exchanger 144 continues to operate, and at 205, it is determined whether the set point of first liquid loop 124 and/or second liquid loop 134 can be maintained by heat exchanger 144 alone. If no, heat exchanger 144 continues to operate, and chiller 140 of second cooling system 132 is activated. Alternatively, as determined at 203, chiller 138 and/or chiller 140 is activated in response to the cooling demand and/or the humidity demand, and operates without heat exchanger 144 in the case that the outside ambient temperature surrounding data center 126 is above the free cooling set point.

Next, at 207, flow control device 150 opens from first liquid loop 124 to second liquid loop 134 to provide intermixing thereof to lower the set point of first liquid loop 124. At 208, it is determined whether the set point of first liquid loop 124 is maintained. If yes, chiller 140 of second liquid loop 134 remains operational to provide cooling to data center 126. However, if the set point is not being maintained, i.e., chiller 140 is operating at a maximum load, flow control device 150 is closed and chiller 138 of first liquid loop 124 is activated at 209 to maintain the set point of first liquid loop 124. At this point, chiller 138 will have enough load to run at higher efficiency. Next, at 210, it is determined if the load on data center 126 has decreased a determined amount (e.g., 25-30%) and is therefore no longer operating as efficiently. If no, control sequence 200 returns to 209 and chiller 138 of first liquid loop 124 remains operational. If yes, chiller 138 of first liquid loop 134 is shut down, and cooling demand is again analyzed at 201.

It can be appreciated that the approaches disclosed herein can be used within a computer system to provide high-efficiency data center cooling. In this case, controller 110 can be provided, and one or more systems for performing the processes described in the invention can be obtained and deployed to computer infrastructure 104. To this extent, the deployment can comprise one or more of (1) installing program code on a computing device, such as a computer system, from a computer-readable storage medium; (2) adding one or more computing devices to the infrastructure; and (3) incorporating and/or modifying one or more existing systems of the infrastructure to enable the infrastructure to perform the process actions of the invention.

The exemplary computer system 102 (FIG. 1) may be described in the general context of computer-executable instructions, such as program modules, being executed by a computer. Generally, program modules include routines, programs, people, components, logic, data structures, and so on, that perform particular tasks or implement particular abstract data types. Exemplary computer system 102 may be practiced in distributed computing environments where tasks are performed by remote processing devices that are linked through a communications network. In a distributed computing environment, program modules may be located in both local and remote computer storage media including memory storage devices.

Computer system 102 carries out the methodologies disclosed herein. For example, the flowchart of FIG. 3 illustrates the architecture, functionality, and operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the blocks might occur out of the order depicted in the figures. For example, two blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Some of the functional components described in this specification have been labeled as systems or units in order to more particularly emphasize their implementation independence. For example, a system or unit may be implemented as a hardware circuit comprising custom VLSI circuits or gate arrays, off-the-shelf semiconductors such as logic chips, transistors, or other discrete components. A system or unit may also be implemented in programmable hardware devices such as field programmable gate arrays, programmable array logic, programmable logic devices or the like. A system or unit may also be implemented in software for execution by various types of processors. A system or unit or component of executable code may, for instance, comprise one or more physical or logical blocks of computer instructions which may, for instance, be organized as an object, procedure, or function. Nevertheless, the executables of an identified system or unit need not be physically located together, but may comprise disparate instructions stored in different locations which, when joined logically together, comprise the system or unit and achieve the stated purpose for the system or unit.

Further, a system or unit of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, as will be described herein, systems/units may also be implemented as a combination of software and one or more hardware devices. For instance, controller may be embodied in the combination of a software executable code stored on a memory medium (e.g., memory storage device). In a further example, a system or unit may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

For example, an implementation of exemplary computer system 102 (FIG. 1) may be stored on or transmitted across some form of computer-readable storage medium. Computer-readable storage medium can be media that can be accessed by a computer. "Computer-readable storage medium" includes volatile and non-volatile, removable and non-removable computer storable media implemented in any method or technology for storage of information such as computer readable instructions, data structures, program modules, or other data. Computer storage device includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer. "Communication medium" typically embodies computer readable instructions, data structures, and program modules. Communication media also includes any information delivery media.

It is apparent that there has been provided an approach for high-efficiency data center cooling. While the invention has been particularly shown and described in conjunction with exemplary embodiments, it will be appreciated that variations and modifications will occur to those skilled in the art. Therefore, it is to be understood that the appended claims are intended to cover all such modifications and changes that fall within the true spirit of the invention.

What is claimed is:

1. A data center cooling system comprising:
   a first cooling system operable to maintain a predetermined set point of a first liquid loop to address an environmental condition of the data center, the first cooling system comprising at least one chiller;
   a second cooling system operable to maintain a predetermined set point of a second liquid loop and to address the environmental condition of the data center, the second cooling system comprising one or more chillers sized such that a total capacity of the one or more chillers of the second cooling system is 20-30% of a total capacity of the at least one chiller of the first cooling system, and wherein the predetermined set point of the first liquid loop is higher than the predetermined set point of the second liquid loop;
   a heat exchanger coupled to the first liquid loop for use when a wet-bulb temperature surrounding the data center is below a free cooling set point, the heat exchanger configured to operate in parallel or in series with the chiller of the first liquid loop; and
   a flow control device coupling the first cooling system with the second cooling system.

2. The data center cooling system according to claim 1, further comprising a plurality of sensor devices for determining the environmental condition surrounding and within the data center.

3. The data center cooling system according to claim 2, wherein the sensors are in communication with the controller.

4. The data center cooling system according to claim 3, wherein the communication is two-way.

5. The data center cooling system according to claim 1, further comprising a controller for operating the chiller of the first cooling system, the chiller of the second cooling system, the heat exchanger, and the flow control device.

6. The data center cooling system according to claim 1, the flow control device comprising a valve.

7. The data center cooling system according to claim 1, further comprising a HVAC unit operable with the second cooling system for maintaining a dew point of the data center.

8. The data center cooling system according to claim 1, wherein the one or more chillers of the second liquid loop has a capacity of approximately 20-30% of the at least one chiller of the first liquid loop.

9. The data center cooling system according to claim 1, wherein the heat exchanger is configured to maintain a set point of the first liquid loop during free cooling operation of the data center cooling system.

10. The data center cooling system according to claim 1, wherein the second liquid loop includes a set of thermal energy storage units.

* * * * *